United States Patent
Rafailovich et al.

(10) Patent No.: US 9,954,241 B2
(45) Date of Patent: *Apr. 24, 2018

(54) ATTACHMENT OF GRAPHENE AND METAL OR METAL OXIDE-MODIFIED GRAPHENE TO ORGANIC POLYMERS USED IN ORGANIC FUEL CELLS

(71) Applicant: The Research Foundation for The State University of New York, Albany, NY (US)

(72) Inventors: Miriam Rafailovich, Plainview, NY (US); Rebecca Isseroff, West Hempstead, NY (US); Hongfei Li, Port Jefferson Station, NY (US); Lee Blackburn, North Woodmere, NY (US); Arthur Chen, North Woodmere, NY (US); Andrew Chen, North Woodmere, NY (US); Sneha Chittabathini, Hicksville, NY (US); Alexandra Tse, North Woodmere, NY (US); Cheng Pan, San Jose, CA (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/218,707

(22) Filed: Jul. 25, 2016

(65) Prior Publication Data

US 2016/0359183 A1    Dec. 8, 2016

Related U.S. Application Data

(63) Continuation-in-part of application No. 14/092,230, filed on Nov. 27, 2013, now Pat. No. 9,401,489.

(Continued)

(51) Int. Cl.
*H01M 8/1051* (2016.01)
*H01M 8/1007* (2016.01)
(Continued)

(52) U.S. Cl.
CPC ......... *H01M 8/1051* (2013.01); *C01B 31/043* (2013.01); *C08J 5/2237* (2013.01);
(Continued)

(58) Field of Classification Search
CPC .................. H01M 8/1051; H01M 8/1007
See application file for complete search history.

(56) References Cited

U.S. PATENT DOCUMENTS

| | | | |
|---|---|---|---|
| 8,637,208 B2 | 1/2014 | Son et al. | |
| 9,401,489 B2 * | 7/2016 | Rafailovich | H01L 51/441 |
| 2009/0227755 A1 | 9/2009 | DeVoe et al. | |

FOREIGN PATENT DOCUMENTS

CN    103022357 A    4/2013

OTHER PUBLICATIONS

Chuang et al., "Gold Nanoparticle-Graphene Oxide Nanocomposites That Enhance the Device Performance of Polymer Solar Cells," Journal of Nanomaterials, vol. 2014, Article ID 736879, pp. 1-12.

(Continued)

Primary Examiner — Olatunji Godo
(74) Attorney, Agent, or Firm — Hoffmann & Baron, LLP

(57) ABSTRACT

A polymer electrolyte membrane fuel cell that includes a positive electrode, a negative electrode, a polyelectrolyte membrane and a solution of reduced graphene oxide and/or graphene oxide functionalized with metallized nanoparticles. The electrodes are coated with a polymer and the polyelectrolyte membrane has a hydrophobic exterior surface that is subjected to ultraviolet/ozone ($UV/O_3$) exposure, which changes the hydrophobic, exterior surface to a hydro- (Continued)

philic exterior surface. The polyelectrolyte membrane is disposed between the positive electrode and the negative electrode and can include a sulfonated tetrafluoroethylene based fluoropolymer-copolymer. The solution forms a coating on the hydrophilic exterior surface of the polymer electrolyte membrane and the positive and negative electrodes. The positive and negative electrodes can be coated with a polymer, preferably polytetrafluoroethylene (PTFE) that can be subjected to ultraviolet/ozone (UV/O$_3$) exposure. The metallized nanoparticles increase the efficiency of the fuel cell by at least 50% when the feed gas includes at least 1000 ppm carbon monoxide.

20 Claims, 11 Drawing Sheets

Related U.S. Application Data

(60) Provisional application No. 61/730,291, filed on Nov. 27, 2012.

(51) Int. Cl.
| | | |
|---|---|---|
| *H01M 8/1039* | (2016.01) | |
| *H01M 4/86* | (2006.01) | |
| *C01B 31/04* | (2006.01) | |
| *C08J 5/22* | (2006.01) | |
| *H01L 51/42* | (2006.01) | |
| *H01L 51/44* | (2006.01) | |
| *H01M 8/1018* | (2016.01) | |

(52) U.S. Cl.
CPC ........ *H01L 51/4253* (2013.01); *H01L 51/441* (2013.01); *H01L 51/442* (2013.01); *H01M 4/8657* (2013.01); *H01M 8/1007* (2016.02); *H01M 8/1039* (2013.01); *C08J 2323/32* (2013.01); *H01M 2008/1095* (2013.01); *Y02E 10/549* (2013.01)

(56) References Cited

OTHER PUBLICATIONS

Pan et al., "Graphene-based functional materials for organic solar cells," Jun. 1, 2012, vol. 2, No. 6, Optical Materials Express, pp. 814-824.

Hou et al., "Active Layer Materials for Organic Solar Cells," (Chapter 2), W.C.H. Choy (ed.), Organic Solar Cells, Green Energy and Technology, DOI: 10.1007/978-1-4471-4823-4_2, pp. 17-42.

Sepe et al., "Structure formation in P3HT/F8TBT blends," Energy and Environmental Science, 2014, 7, pp. 1725-1736.

Isseroff et al., "Increasing Polymer Solar Cell Active Layer Efficiency and Organization by Adding Gold-Functionalized Reduced Graphene Oxide," Mater. Res. Soc. Symp. Proc., vol. 1500, 2013 Materials Research Society, DOI: 10.1557/opl.2013.183.

"Ultraviolet-Ozone Surface Treatment," Three Bond Technical News, Issued Mar. 20, 1987, pp. 1-10.

Lu et al., "Morphological Characterization of a Low-Bandgap Crystalline Polymer:PCBM Bulk Heterjunction Solar Cells," Adv. Energy Mater. XX: 1-9 (2011).

Eda et al., "Chemically Derived Graphene Oxide: Towards Large-Area Thin-Film Electronics and Optoelectronics," Adv. Mater. 22: 2392-2415 (2010).

Gao et al., "Anode modification of inverted polymer solar cells using graphene oxide," Applied Physics Letters, 97, 203306 (2010), pp. 1-3.

Jørgensen et al., "Stability/degradation of polymer solar cells," Solar Energy Materials & Solar Cells 92 (2008), pp. 686-714.

Weihao Ge, "An overview on P3HT:PCBM, the most efficient organic solar cell material so far," Solid State Physics II, Spring 2009, Instructor: Elbio Dagatto, University of Tennessee.

Jenna deBoisblanc, "Synthesis and Characterization of P3HT:PCBM Organic Solar Cells," Senior thesis, pp. 1-44, May 4, 2010, Advisors: David Tanenbaum and Alma Zook.

Xu et al., "Polymer photovoltaic devices with transparent graphene electrodes produced by spin-casting," Carbon 48: 3293-3311 (2010).

Lee et al., "Flexible organic solar cells composed of P3HT:PCBM using chemically doped graphene electrodes," Nanotechnology 23 344013: 1-6 (2012).

Kim et al., "Photocrosslinkable Polythiophenes for Efficient, Thermally Stable, Organic Photovaltaics," Adv. Funct. Mater., 19:2273-2281 (2009).

Yang et al., "Uniform Decoration of Reduced Graphene Oxide Sheets with Gold Nanoparticles," Journal of Nanotechnology, vol. 2012, Article ID 328565, 8 pages, doi:10.1155/2012/328565.

Zhang et al., "High-conductivity graphene nanocomposite via facile, covalent linkage of gold nanoparticles to graphene oxide," Chinese Science Bulletin, 2012, vol. 57, No. 23: 3086-3092, doi10.1007/s11434-012-5333-6.

Nam et al, "Effects of direct solvent exposure on the nanoscale morphologies and electrical characteristics of PCBM-based transistors and photovoltaics," J. Mater. Chem., 2012, 22, 5545-5549.

* cited by examiner

ATTACHMENT OF GRAPHENE AND METAL OR METAL OXIDE-MODIFIED GRAPHENE TO ORGANIC POLYMERS USED IN ORGANIC FUEL CELLS

This application claims priority based on U.S. patent application Ser. No. 14/092,230, filed on Nov. 27, 2013 and issued on Jul. 26, 2016 as U.S. Pat. No. 9,401,489, which claims priority based on U.S. provisional application No. 61/730,291, filed on Nov. 27, 2012; PCT Application No. PCT/US2015/021800, filed on Mar. 20, 2015, which claims priority based on U.S. provisional application No. 61/968,022 filed on Mar. 20, 2014; and U.S. patent application Ser. No. 14/724,520, filed on May 28, 2015, which claims priority based on U.S. provisional application No. 62/003,926 filed on May 28, 2014.

FIELD OF THE INVENTION

The present invention is a polymer electrolyte membrane fuel cell and a method for making such a fuel cell. In particular, the present invention relates to a polymer electrolyte membrane fuel cell, wherein the polymer surfaces are subjected to ultraviolet/ozone exposure and then contacting the polymer surfaces with reduced graphene oxide or graphene functionalized with metal nanoparticles.

BACKGROUND OF INVENTION

The hydrogen fuel cell or polymer electrolyte membrane fuel cell ("PEMFC" or "PEM" fuel cell) is one of the most promising future alternative energy sources, particularly attractive for automobile applications due to its high efficiency, high energy density, and low or zero emissions. However, its relatively low power output has prevented it from many practical applications. Typical applications for PEM fuel cells are backup power, portable power, distributed generation and transportation. The advantages of PEM fuel cells are that they can be used with solid electrolyte, have high power density, a low operation temperature, quick start-up and almost pollution-free emissions. The disadvantages are expensive catalysts, sensitive to impurities and they have low temperature waste heat. The hydrogen gas for the fuel cells can be obtained from natural gas reforming, water electrolysis and photo-catalytic water splitting.

In fuel cells, power is generated via the conduction of protons—positively charged hydrogen ions (H+)—through a polyelectrolyte membrane, commonly composed of a sulfonated tetrafluoroethylene based fluoropolymer-copolymer (NAFION®). The function of the fuel cell constitutes a balance between hydrogen oxidation and oxygen reduction reactions where platinum (Pt) nanoparticles are used to catalyze the reactions at the electrodes. Under ambient conditions where carbon dioxide ($CO_2$) is present, carbon monoxide (CO) is one of the byproducts of the fuel cell operation, which is produced on the NAFION® membrane as a result of the Pt catalyzed $H_2$ reduction at the anode, or via the reverse water gas shift reaction (RWGS) at the cathode. In either case, the rate constant for oxidation of CO is lower than that for the other reactions, especially below 400K, resulting in accumulation and subsequent migration to the electrodes where amounts, as low as 75 ppm, poison the Pt catalyst and can reduce the power output by more than 50%.

The decreased efficiency of energy conversion of a hydrogen fuel cell is mainly caused by the slow kinetics of the oxygen reduction reaction (ORR) and the presence of contaminants in the fuel stream. The presence of trace amounts of carbon monoxide in hydrogen fuel produced from the reforming process, and via routine operation in $CO_2$ containing ambient atmosphere, can reduce fuel cell efficiency considerably when platinum is the electro-catalyst material. Recently, considerable advances have been made in fuel cell electrocatalysis moving away from conventional Pt catalysts to improved electrocatalysts (mostly nanosized), which have increased the understanding of the reaction kinetics. However, the lack of high efficiency due to contaminants is still one of the major challenges of electrocatalysis, in addition to the problem of the stability of Pt.

It is known that gold nanoparticles (Au NPs) are very effective catalysts of the CO oxidation reaction. An essential condition of this process though is the formation of hemispherical shaped particles in direct contact with metal oxide supports, where a two-step catalytic process is postulated at the perimeter of the particles which reduces the energy barrier and increases the reaction rate. Hence, despite their potential utility, these particles have not been effective in moderating the fuel cell operation since their deposition requires very high temperatures that cannot be achieved on a polymer membrane.

Au nanoparticles can be effective catalysts of the CO oxidation reaction at low temperatures when good contact with certain metal oxide (e.g., titanium dioxide, $TiO_2$) substrates is established. It is believed that the Au nanoparticles are oblate-shaped and form a stepped interface at the contact line with the $TiO_2$ substrate. The atomic steps then provided perimeter sites for adsorption of the reactants which enabled a two-step oxidation process to occur. In this model, the substrate first interacted with the reactants, allowing bond stretching on the support surface. This decreased the barrier to the catalytic process which occurred on active sites at the perimeter of the Au nanoparticles thereby greatly increasing the efficiency and reducing the operating temperature of the CO oxidation reaction. The model was not unique to TiO2 and a similar mechanism was recently proposed for cerium dioxide ($CeO_2$). This type of reaction has not been used to eliminate CO poisoning of PEM fuel cells because the high temperatures involved in formation and deposition of the particles are not practical for implementation on polymer membranes and, hence, incorporation into PEM fuel cells was never attempted.

A PEMFC is a device that can directly convert the chemical energy in hydrogen to electrical energy at low temperature in the presence of catalysts. A polymer membrane, usually a NAFION® membrane, is utilized to separate ions and electrons, while two electrodes that contain loadings of carbon black and platinum (Pt) catalysts are placed at both sides of the membrane. Nanoparticles are common catalytic components of fuel cells. Most catalysts are loaded on the electrodes to catalyze the reaction. Platinum is the most common and efficient catalyst for PEM fuel cell, but Pt is precious and expensive. Generally, the two desired reactions that occur in hydrogen fuel cells are the hydrogen oxidation reaction (HOR) at the anode and the ORR at the cathode. The HOR occurs readily on Pt-based catalysts (rate constant $\sim 10^{-5}$ molsec$^{-1}$ cm$^{-2}$) and, in a fuel cell, is usually controlled by mass transfer limitations. The ORR actually can proceed by two pathways in aqueous electrolytes, which is called "four-electron pathway," and the other one is known as the peroxide or "two-electron" pathway ($O_2 + 2H^+ + 2e^- \rightarrow {}^*H_2O_2$).

A polymer membrane, which is usually made out of NAFION®, is used to separate ions and electrons in hydrogen fuel cell. NAFION® is a sulfonated tetrafluoroethylene based fluoropolymer-copolymer. A tetrafluoroethylene (TEFLON®) backbone gives NAFION® its mechanical strength while the pendent sulfonate groups facilitate ion conduction. NAFION® does not conduct electrons, but does allow positive ions, typically protons in PEM cells, to pass through via interaction with clusters of sulfonate-ended perfluoroalkyl ether groups. The structure of these clusters is still under investigation and has been proposed to result from assemblies ranging from inverted micelles to cylindrical nanochannels. In all of the proposed models, channels with —$SO^{-3}$ groups facilitate transport of positively charged species.

Operating a fuel cell with pure hydrogen exhibits the best power output; however, pure hydrogen is very expensive and difficult to store. Alternatives to pure hydrogen usually come from reformed hydrogen gas from natural gas, propane, or alcohols. Even though the reformed gas is purified, some contaminants, such as CO and $CO_2$ species can persist in the gas feed. CO can poison the catalyst by blocking active sites on the catalyst's surface. Consequently, sites are no longer available for hydrogen adsorption and subsequent oxidation. It is known that when CO content is larger than 25 ppm, it has severe effects on Pt catalysts. CO poisoning can also occur when air is blown in the cathode, where $CO_2$ in the air can be reduced to CO and, therefore, block the active Pt sites on the cathode.

Accordingly, there is a need for PEMFC that can operate using reformed gas containing contaminants without an intermediate purification step to remove the contaminants. There is also a need for a PEMFC that have high output power and are cost efficient to operate.

SUMMARY OF THE INVENTION

In accordance with the present invention, a polymer electrolyte membrane fuel cell is provided. The polymer electrolyte membrane fuel cell comprising, consisting of or consisting essentially of: a positive electrode, a negative electrode, a polyelectrolyte membrane and a solution of reduced graphene oxide and/or graphene oxide functionalized with metallized nanoparticles. The polyelectrolyte membrane has a hydrophobic exterior surface that is subjected to ultraviolet/ozone (UV/$O_3$) exposure, which changes the hydrophobic, exterior surface to a hydrophilic exterior surface. The polyelectrolyte membrane is disposed between the positive electrode and the negative electrode and can include a sulfonated tetrafluoroethylene based fluoropolymer-copolymer.

The solution of reduced graphene oxide and/or graphene oxide is functionalized with nanoparticles of gold, platinum, palladium, silver, copper or their alloys or mixtures thereof. Preferably, the solution is functionalized with gold and platinum nanoparticles or the functionalized solution includes $AuCl_4$. The solution forms a coating on the hydrophilic exterior surface of the polymer electrolyte membrane and the positive and negative electrodes. The nanoparticles can have a truncated cuboctahedron structure and can have an average particle diameter of from 1.88 nm to 3.54 nm. The positive and negative electrodes can be coated with a polymer, preferably polytetrafluoroethylene (PTFE). The polymer coating can be subjected to ultraviolet/ozone (UV/$O_3$) exposure.

The polymer electrolyte membrane fuel cell can use a feed gas that includes a gaseous composition containing hydrogen molecules ($H_2$) and carbon monoxide (CO) in contact with the positive electrode. The nanoparticles increase the efficiency of the fuel cell by at least 50% when the feed gas includes at least 1000 ppm carbon monoxide. Platinum nanoparticles can increase the efficiency of the fuel cell by at least 90% using the same feed gas and a combination of platinum and gold nanoparticles increase the efficiency of the fuel cell by 100%, i.e., the efficiency is the same as pure $H_2$ feed gas.

The present invention also includes a method for making a polymer electrolyte fuel cell comprising, consisting of or consisting essentially of: (1) forming a polymer electrolyte membrane having an exterior surface, wherein the exterior surface is hydrophobic; (2) subjecting the hydrophobic exterior surface of the polymer electrolyte membrane to ultraviolet/ozone (UV/$O_3$) exposure, wherein the UV/$O_3$ exposure changes the hydrophobic exterior surface to a hydrophilic exterior surface; (3) disposing the polymer electrolyte membrane with the hydrophilic exterior surface between a positive electrode and a negative electrode; (4) preparing a solution comprising reduced graphene oxide and/or graphene oxide; (5) functionalizing the solution with nanoparticles of gold, platinum, palladium, silver, ferric oxide, copper or their alloys or mixtures thereof; and (6) contacting the hydrophilic exterior surface of the polymer electrolyte membrane and the positive and negative electrodes with the functionalized solution.

BRIEF DESCRIPTION OF THE FIGURES

The preferred embodiments of the method of attaching reduced graphene oxide and/or graphene oxide to a polymer layer of the present invention, as well as other objects, features and advantages of this invention, will be apparent from the accompanying drawings wherein.

DETAILED DESCRIPTION OF THE INVENTION

Figure 1:
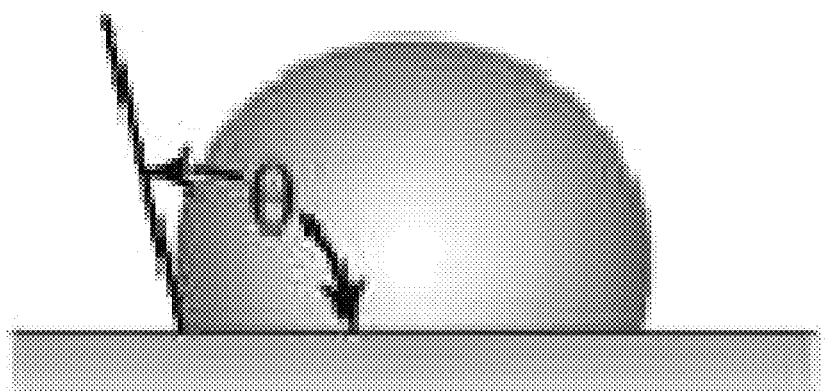
FIG. 1 shows a water droplet on a hydrophobic surface and the contact angle, θ.

The present invention is a polymer electrolyte membrane fuel cell and a method for making such a fuel cell. Reduced graphene oxide and/or graphene oxide functionalized with metal nanoparticles is coated onto the exterior surfaces of polymer layers formed on the electrodes and/or on the polymer membrane of the fuel cell. The metal functionalized reduced graphene oxide coated polymer layers replace aluminum electrodes, which easily oxidize.

The susceptibility of the platinum catalyst of a Polymer Electrolyte Membrane Fuel Cells ("PEMFC") to poisoning by carbon monoxide (CO) reduces its output power. In an effort to diminish poisoning, the present invention incorporates metal nanoparticles, preferably gold and platinum nanoparticles, onto partially reduced graphene oxide (AuPt-prGO) sheets to reduce both nanoparticle aggregation and the amount of precious metal needed. Applying this material onto the electrodes and NAFION® membrane of a PEMFC, after the exterior surfaces were subjected to $UV/O_3$ exposure, was found to increase CO tolerance as well as power output.

Another objective of the present invention is to improve the fuel cell efficiency in the presence of contaminants by using a co-catalyst, or exploiting a "two step catalysis" of the catalytic process. The process is based on initial bond stretching of the reactants on metal oxide supports, which reduces the reaction barrier and facilitates the action of the catalyst. Even though the applicability of this concept to operation of the PEM fuel cells was highlighted, its implementation in an actual device was not practical since the high temperature synthesis and deposition processes which were not compatible with the polymer membranes involved in the ion transport process.

As used herein, the terms "reduced graphene oxide" (RGO) and "chemically derived graphene" (CDG) refer to a material resulting from chemical exfoliation of graphite.

As used herein, the term "ultraviolet/ozone" ("$UV/O_3$") exposure refers to a method for altering the polymer chains on the surface of a polymer. The $UV/O_3$ exposure creates free radicals which oxidize the surface region rendering it polar and hydrophilic. The $UV/O_3$ exposure also etches the surface of the polymer and can produce roughness. Therefore, the optimal $UV/O_3$ treatment lasts for only the minimum amount of time required to etch a few nanometers and chemically oxidize the surface.

As used herein, the term "hydrophobic polymer" refers to a polymer that repels, tends not to combine with, or is incapable of dissolving in water. Characteristics of hydrophobic polymer surfaces are high contact angle with a water droplet, poor adhesiveness, poor wettability and low solid surface free energy.

As used herein, the term "hydrophilic polymer" refers to a polymer having an affinity for water and readily absorbed or dissolved in water. Generally, hydrophilic polymers are those polymers of chains of chemical compounds that have polar or charged functional groups, rendering them soluble in water. Characteristics of hydrophilic polymer surfaces are low contact angle, good adhesiveness, good wettability and high solid surface free energy.

As used herein, the term "contact angle" refers to the angle, conventionally measured through the liquid, where a liquid/vapor interface meets a solid surface. It quantifies the wettability of a solid surface by a liquid via the Young equation ($0=\gamma_{SG}-\gamma_{SL}-\gamma_{LG} \cos \theta_C$, wherein $\gamma_{SG}$ s the solid-vapor interfacial energy, $\gamma_{SL}$ is the solid-liquid interfacial energy, $\gamma_{LG}$ is the liquid-vapor interfacial energy (i.e., the surface tension) and $\theta_C$ is the equilibrium contact angle). A given system of solid, liquid and vapor at a given temperature and pressure has a unique equilibrium contact angle. Generally, if the water contact angle is smaller than 90°, the solid surface is considered hydrophilic and if the water contact angle is larger than 90°, the solid surface is considered hydrophobic. Many polymers exhibit hydrophobic surfaces. Highly hydrophobic surfaces made of low surface energy (e.g. fluorinated) materials may have water contact angles as high as ~120°.

As used herein, the term "spin coating" refers to a procedure used to deposit uniform thin films onto flat substrates. Usually, a small amount of coating material is applied on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the viscosity and concentration of the solution and the solvent.

As used herein, the term "exciton" refers to a bound state of an electron and an electron hole, which are attracted to each other by the electrostatic Coulomb force. It is an electrically neutral quasiparticle that exists in insulators, semiconductors and in some liquids. The exciton is regarded as an elementary excitation of condensed matter that can transport energy without transporting net electric charge.

As used herein, the term "homogenous dispersion" refers to a system in which particles are dispersed in a continuous phase of a different composition and do not display any structure; i.e., the particles dispersed in the liquid or solid matrix (the "dispersion medium") are assumed to be statistically distributed. With respect to the dispersions formed herein, agglomerated particles of AuGO or AuRGO in the dispersion are separated from each other and a new interface, between an inner surface of the liquid dispersion medium and the surface of the particles to be dispersed, is generated.

As used herein, the terms "Polymer Electrolyte Membrane Fuel Cells" and "Proton Exchange Membrane Fuel Cells" ("PEMFC"), refer to a fuel cell that transforms the chemical energy liberated during the electrochemical reaction of hydrogen and oxygen to electrical energy, as opposed to the direct combustion of hydrogen and oxygen gases to produce thermal energy.

As used herein, the term "weight ratio" refers to the amounts of each component in the composition as a ratio of the weight of each component. For example, if the composition contained 0.5 mg of RGO, 20 mg of PSS, 20 mg of P3HT and 20 mg of PCBM, the weight ratio of the components in the composition would be 0.5:20:20:20. In another example, if the composition contained 20 mg of a GO/PSS dispersion, 20 mg of P3HT and 20 mg of PCBM, the weight ratio of the components in the composition would be 20:20:20.

As used herein, the terms "metal-GO" and "metal-RGO" refer to graphene oxide (GO) or reduced graphene oxide (RGO), respectively, that is functionalized by a metal, preferably gold (Au), platinum (Pt), palladium (Pd) or ferric oxide ($Fe_2O_3$).

As used herein, the terms "anode" and "positive electrode" are interchangeable and refer to a positively charged electrode, wherein positive current flows in and electrons flow out.

As used herein, the terms "cathode" and "negative electrode" are interchangeable and refer to a negatively charged electrode, wherein negative current flows out and electrons flow in.

As used herein, "Raman spectroscopy" is a spectroscopic technique used to observe vibrational, rotational, and other low-frequency modes in a system. Raman spectroscopy is commonly used in chemistry to provide a fingerprint by which molecules can be identified. The main features in the Raman spectra of carbons are the so-called G and D peaks, which lie at around 1560 and 1360 $cm^{-1}$, respectively, for visible excitation. The G peak is due to the bond stretching of all pairs of $sp^2$ atoms in both rings and chains. The D peak is due to the breathing modes of $sp^2$ atoms in rings. See Ferrari, Andrea C., "Raman spectroscopy of graphene and graphite: Disorder, electron-phonon, coupling, doping and nonadiabatic effects," Solid State Communications, 143 (2007) 47-57, which is incorporated herein in its entirety.

Gold nanoparticles that are platelet shaped and have direct contact to the substrate have been found to be the perfect catalysts. It has also been found that platelet-shaped nanoparticles of platinum, palladium, silver, copper or their alloys or mixtures thereof can be used in place of gold. In one embodiment of the present invention, hydrophobic, thiol-functionalized gold nanoparticles are synthesized through two-phase method. When particle solution is spread at the air water interface, EXAFS spectroscopy indicates that some of the gold atoms are removed, as the water displaces the hydrophobic thiol chains from the particle surface, resulting in platelet shaped particles. Furthermore, after these nanoparticles are spread on the surface of water in a Langmuir-Blodgett ("LW") trough where surface pressure can be applied to compress them, they form LB film consisting of one or more monolayers. This LB film can then be deposited onto a solid surface, such as the NAFION® membrane where the particle surface can make direct contact with electrodes and take effect. It has also been found that the optimal surface pressure for forming gold nanoparticles monolayer to achieve the highest enhancement of output power is between about 0.5 and 3.0 mN/m, preferably between about 1.0 and 2.0 mN/m.

The present invention is a method for producing hemispherical particles 2.71±0.83 nm in diameter and 1.7 nm thick. The particles are formed using the Langmuir method the air/water interface and deposited as a uniform film on the NAFION® membranes of the fuel cell membrane electrode assembly (MEA). The coated membranes of the present invention enhance the current and power output of PEMFCs, operated under ambient conditions, by more than 50%, without a corresponding increase in voltage. Density functional theory (DFT) calculations indicate that the particles, working in synergy with the $SO_3$ functional groups on the NAFION® membrane reduce the activation barrier and increase the reaction rate constant for CO oxidation, which was the rate limiting step at room temperature. The calculations indicate that the NAFION® membrane participates in the two step catalysis process of the reverse gas shift reaction in the same manner as Au deposited on metal oxides.

In one embodiment, oblate shaped Au particle nanoplatelets, with an aspect ratio of approximately two and only three atomic layers thick, are reproducibly formed at the air water interface, and then coated as a film onto any arbitrary surface simply by using the Langmuir-Blodgett technique. When this film is deposited directly onto the membrane of a PEM fuel cell, the efficiency of the cell is enhanced by more than 50%, when operated under ambient conditions. This enhancement occurs only when the particles are placed as a single layer, in direct surface contact with the NAFION® membrane, in a manner similar to the complexes reported on $TiO_2$. It was believed that the two step catalysis process also occurs on the NAFION® membrane, where the oxidation of CO at the perimeter of the Au nanoparticles is facilitated by the sulfonic groups present on the NAFION® polymer. These results are consistent with DFT calculations, which show that activation barrier for CO oxidation by the gold-sulfonic group complex temperature is reduced to 11.94 Kcal/mole, enabling the reaction to occur at room temperature.

In another embodiment, hydrophobic, thiol-functionalized gold nanoparticles were synthesized through a two-phase method. A gold nanoparticles layer with three atomic layers thick at the air water interface was then formed. After these nanoparticles are spread on the surface of water in a Langmuir-Blodgett trough where surface pressure can be applied to compress them, they form LB film consisting of one or more monolayers. These Au particles were then directly deposited onto the NAFION® membrane in the PEM fuel cell, resulting in 80% enhancement of the efficiency of the fuel cell. It was found that this kind of enhancement occurs only when the particles are in direct surface contact with the membrane and does not occur when the nanoparticles are incorporated into the electrodes.

The most efficient location for the Au or Pt catalysts is on the membrane, which shortens the pathway that ions need to travel and, thus, increases the efficiency of separating ions and electrons. Gold nanoparticles, which are platelet shaped and have direct contact to the substrate, possess special catalytic capabilities. The activity of gold nanoparticles increases when the particle size shrinks, which is due to the increasing fraction of corner atoms. Gold nanoparticles are known to be very effective for the oxidation of carbon monoxide (CO). Reducing the size of gold nanoparticles to around 2 nm increases the activity of gold nanoparticles.

Inorganic solar cells are expensive, but organic polymer solar cells can potentially be produced at significantly lower costs. However, up until now the efficiencies of organic polymer solar cells are low (about 1-2.5%) due to donor and acceptor substances contacting the cathode and anode electrodes. This causes the recombination of the charge carriers as well as current leakage. In addition, aluminum electrodes placed on the polymer cells require evaporation under an ultra-high vacuum, and aluminum oxidizes easily, causing further degradation of the solar cell. Accordingly, the present invention replaces the aluminum electrodes with graphene.

In the present method, graphene is used to form a transparent, conducting electrode, with a work function of 4.5 eV, which is comparable to the work function of aluminum of 4.3 eV. Synthesizing reduced graphene oxide (RGO) in bulk keeps the RGO suspended in an alcohol-water solvent. However, it is still difficult to apply the RGO suspension onto the surface of a hydrophobic polymer layer. Spin coating the RGO suspension onto a polymer layer, such as a P3HT:PCBM blend layer, to form a solar cell causes the RGO to fly off with only small amounts adhering to the surface due to incompatibility of the RGO suspension and the polymer surface.

One aspect of the present invention treats the exterior surface of a hydrophobic polymer by exposing it to UV/ozone to render the exterior surface hydrophilic and, thus, enable the deposition of graphene via a number of convenient and environmentally sustainable water processable techniques. Exposing the surfaces of hydrophobic polymers to $UV/O_3$ changes the nature of the surface from hydrophobic to hydrophilic by chemically altering the branches of the polymer chains on the surface. The hydrophilic surface is more receptive to water-based liquids and significantly increases the efficiency of spin coating methods.

In addition to spin coating, the reduced graphene oxide can be applied by first forming a thin sheet of graphene oxide and then transferring the thin sheet onto the polymer surface. One method of forming the thin film uses a Langmuir Blodgett (LB) trough, as disclosed by Kim et al., *Jpn. J. Appl. Phys.* 2003, 42, 7629. Reduced graphene oxide and/or gold nanoparticle-reduced graphene oxide solution or suspension is applied to the surface of the water on the trough after the solar cell has been submerged below the water surface. The solar cell is then pulled up by the dipper while the barriers slowly compress. This evenly deposits a film on the active layer surface of the solar cell.

Figure 2:
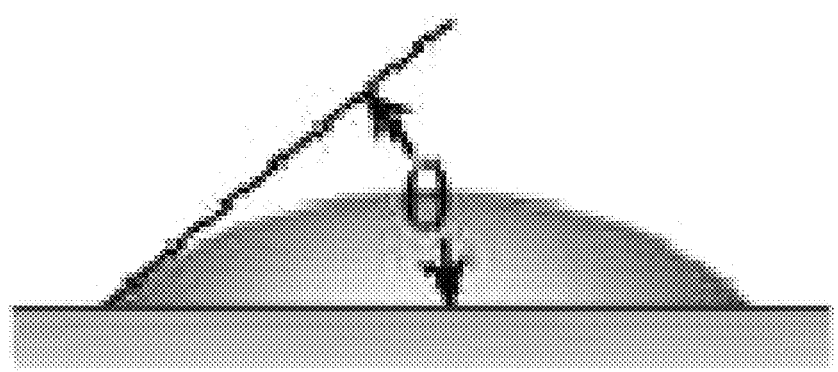
FIG. 2 shows a water droplet on a hydrophilic surface and the contact angle, θ.
Figure 3:
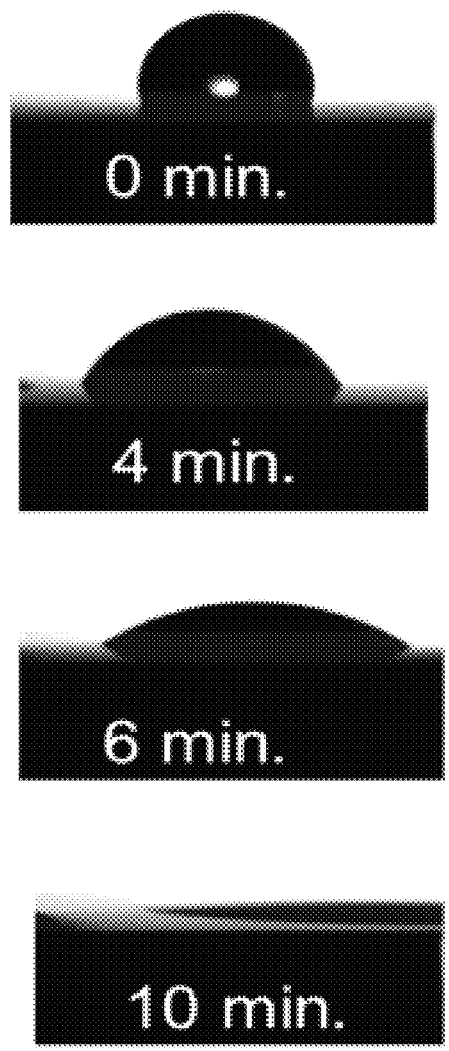
FIG. 3 shows a water droplet on a hydrophobic surface over time from 0 to 10 minutes as the surface is exposed to UV/$O_3$.

The effectiveness of the UV/ozone exposure is evidenced by the contact angle goniometry, which is a measure of the water contact angle with the surface and hence the degree of hydrophilicity. In this technique, complete wetting by water over the polymer surface is demonstrated by zero value for the contact angle, and values above 90 degrees are considered hydrophobic. See FIGS. 1 and 2, which show a water droplet on a hydrophobic surface and a water droplet on a hydrophilic surface, respectively, and the contact angle, θ. FIG. 3 illustrates how the contact angle of a water droplet on a hydrophobic thin film decreases with increasing UV/ozone exposure over time (from an untreated polymer at 0 minutes to a treated polymer at 10 minutes), completely wetting the surface after 10 minutes of exposure time.

Using the method of the present invention decreases the surface contact angle from an initial hydrophobic value of greater than 70°, preferably more than 80°, more preferably greater than 90°, and in some cases greater than 100° to a much smaller value of less than 70°, preferably less than 50° and most preferably less than 40°. After exposing the polymer surface to UV/ozone for anywhere from 30 seconds to one hour, preferably from 1 to 20 minutes, more preferably from 5 to 10 minutes and most preferably about 7 to 8 minutes, the surface can be easily wetted with the reduced graphene oxide solution. The ability to wet the polymer surface indicates that the surface has become hydrophilic.

The GO can be formed using a modified Hummers method as disclosed in U.S. Patent Pub. No. US 20011/0281035 A1, which is incorporated herein in its entirety. Other well-known methods for forming GO can also be used. The GO is then suspended in an alcohol-water solvent and reduced using sodium borohydride ($NaBH_4$) as a reductant. Unreduced graphene oxide can also be used either alone or together with the reduced graphene oxide. The preferred ratio of alcohol to water in the solvent is 10 vol. % alcohol to 90 vol. % water, more preferably 25 vol. % alcohol to 75 vol. % water. Other solvents that can be used are water, ethanol, ethanol-water mixtures, and dilute NaOH solutions. Gold-nanoparticles can be added to the suspension to create a gold-nanoparticle functionalized graphene by dissolving a concentration of 0.05 mmolar $AuCl_4$ in GO suspended in 10 vol. % ethanol to 90 vol. % ethanol (preferably 50 vol. % ethanol to 50 vol. % $H_2O$, more preferably 25 vol. % ethanol to 75 vol. % water) and allow this to stir overnight. Preferably, deionized water is used. The mixture is then reduced by adding $NaBH_4$, preferably enough $NaBH_4$ is added so that the mixture has a 15 mmolar concentration $NaBH_4$. The addition of $NaBH_4$ immediately turns the solution black. The mixture is then stirred from 4 to 16 hours, preferably from 8 to 12 hours to allow an Au-graphene precipitate to form. The precipitate is dried in a vacuum oven to form a dried powder, which can be mixed with a solvent and spin cast onto a solar cell active polymer layer that has been treated with UV/ozone to make it compatible with a hydrophilic solvent. If the $NaBH_4$ reduction is not fully completed and a precipitate does not form, the solution can be used directly for spin casting onto the solar cell active polymer layer.

The polymer layer initially has a hydrophobic exterior surface and it is difficult to apply the RGO solvent or suspension to it. Preferably, the polymer is a poly-3-hexyl thiophene (P3HT) and phenyl-$C_{61}$-butyric acid methyl ester blend (P3HT:PCBM). After exposure to $UV/O_3$, the exterior surface of the polymer layer becomes hydrophilic and the RGO solvent or suspension readily adheres to the surface. Tests showed that spin coating the RGO suspension onto the $UV/O_3$ modified polymer surface caused increased adhesion to the point where longer spinning time was required to evaporate the solvent from the surface.

The ultraviolet/ozone ($UV/O_3$) exposure can be provided by different $UV/O_3$ generators that are well known to those skilled in the art and commercially available. For example, ultraviolet lamps are frequently used to generate ozone. A UV lamp emits UV light at 185 nanometers (nm). Air (usually ambient air) is passed over an ultraviolet lamp, which splits oxygen ($O_2$) molecules in the gas. The resulting oxygen atoms ($O^-$), seeking stability, attach to other oxygen molecules ($O_2$), forming ozone ($O_3$). The polymer surface is exposed to the ozone for a time sufficient to change the exterior surface from hydrophobic to hydrophilic. Longer exposure and greater concentrations of $O_3$ result in the polymer surface becoming more hydrophilic.

The addition of metal-prGO to the electrodes and to the NAFION® membrane of the hydrogen fuel cell increases both CO tolerance and overall output power. Metalized prGO can be coated onto polytetrafluoroethylene ("PTFE") electrodes by exposing the electrodes to UV/ozone and then immersing the electrodes in the metal-prGO solution and drying overnight. Higher CO tolerance allows the use of inexpensive reformate $H_2$ gas ($00.04/kWh) and less need to compensate for catalyst poisoning. Reformate gas contains 10-50 ppm of CO (Natural Sciences and Engineering Research Council of Canada, 2003); this test used 1000 ppm and still maintained 100% of its highest output power.

Figure 4:
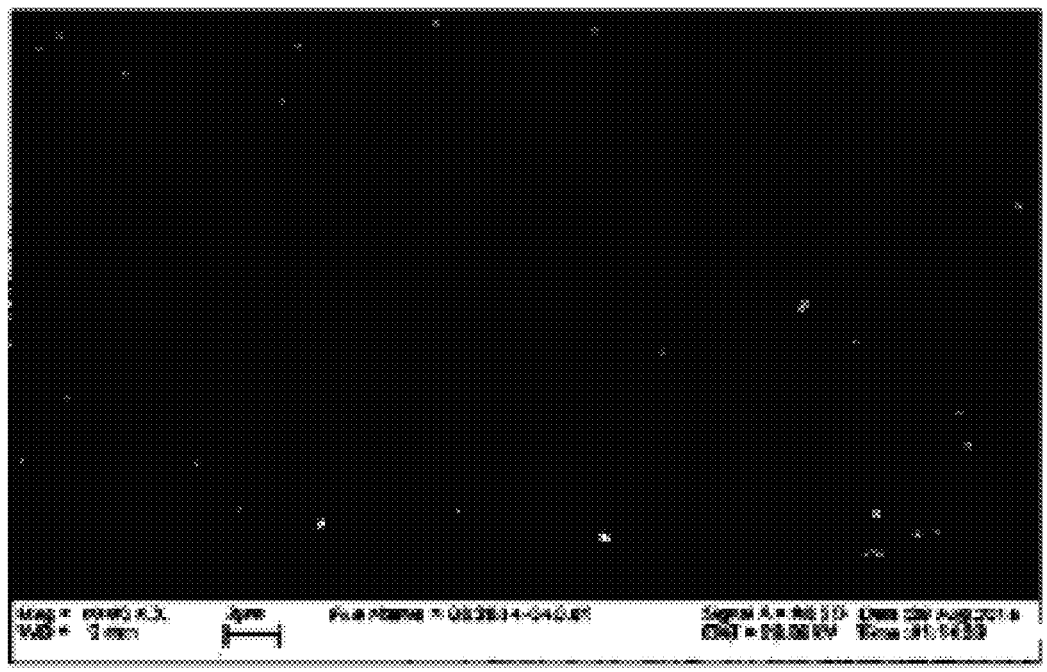
FIG. 4 is a 20 kV Scanning Electron Microscope ("SEM") image showing the dispersion of gold-platinum ("AuPt") nanoparticles throughout a partially reduced graphene oxide ("prGO") sheet.
Figure 5:
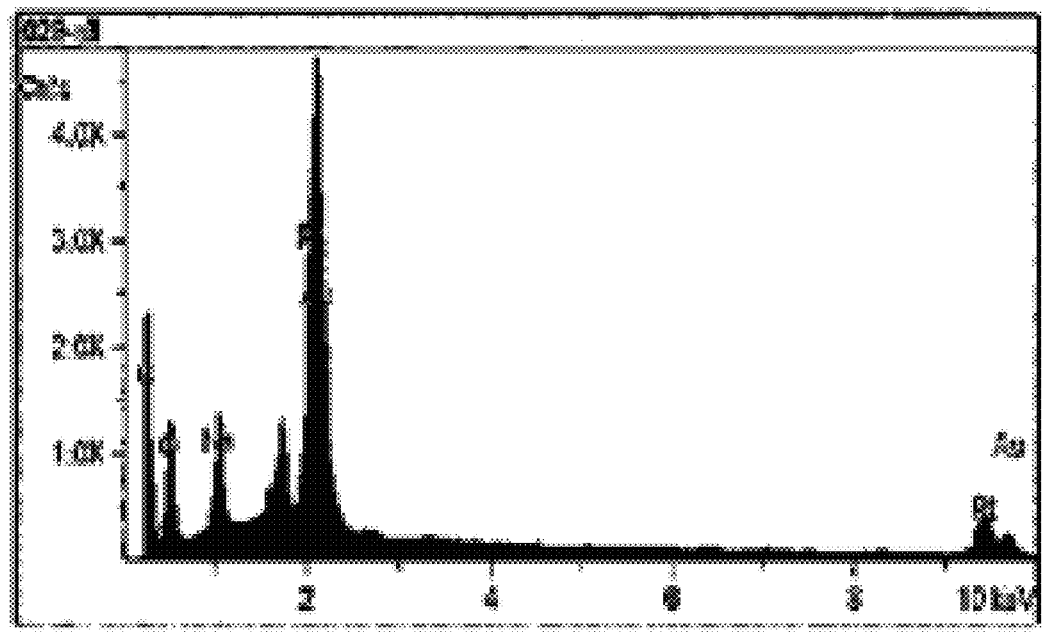
FIG. 5 is an Energy Dispersive X-ray ("EDX") Spectrum of the AuPt-prGO sheets in FIG. 4.
Figure 6:
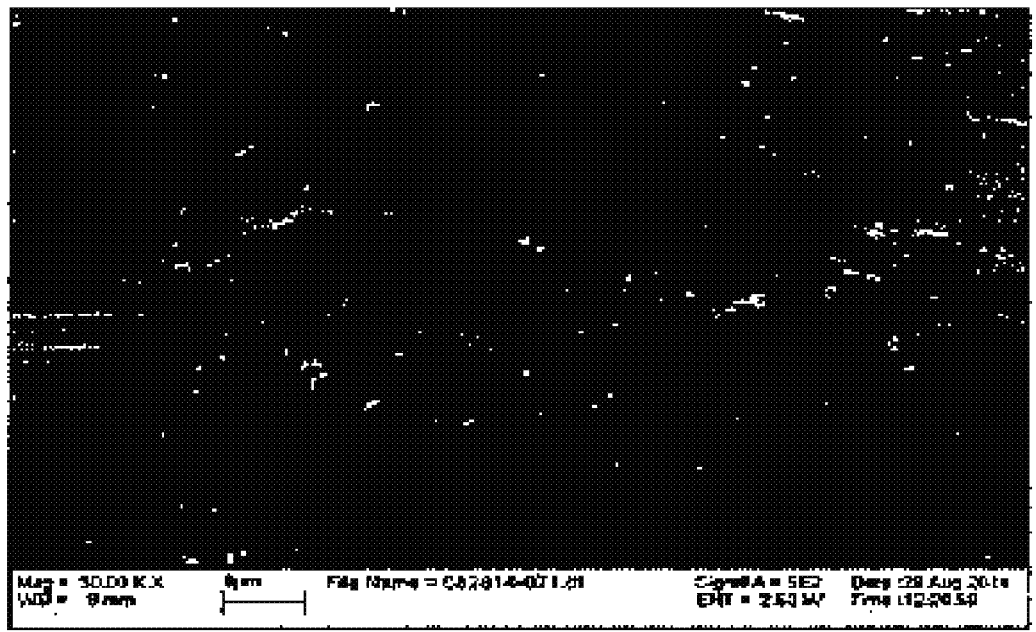
FIG. 6 is a 2.5 kV SEM image of a sheet studded with AuPt nanoparticles impeding aggregation.

Referring now to the figures, FIG. 4 is a 20 kV SEM image showing the dispersion of gold-platinum ("AuPt") nanoparticles throughout a partially reduced graphene oxide ("prGO") sheet. FIG. 5 is an EDX spectrum of the AuPt-prGO sheets in FIG. 4, wherein the electron beam focused on specific nanoparticles. Peaks of Au and Pt are seen at 2 keV, with another peak at 10 keV due to the higher binding energy of a core electron. FIG. 6 is a 2.5 kV SEM image of a sheet studded with AuPt nanoparticles impeding aggregation.

Figure 7:
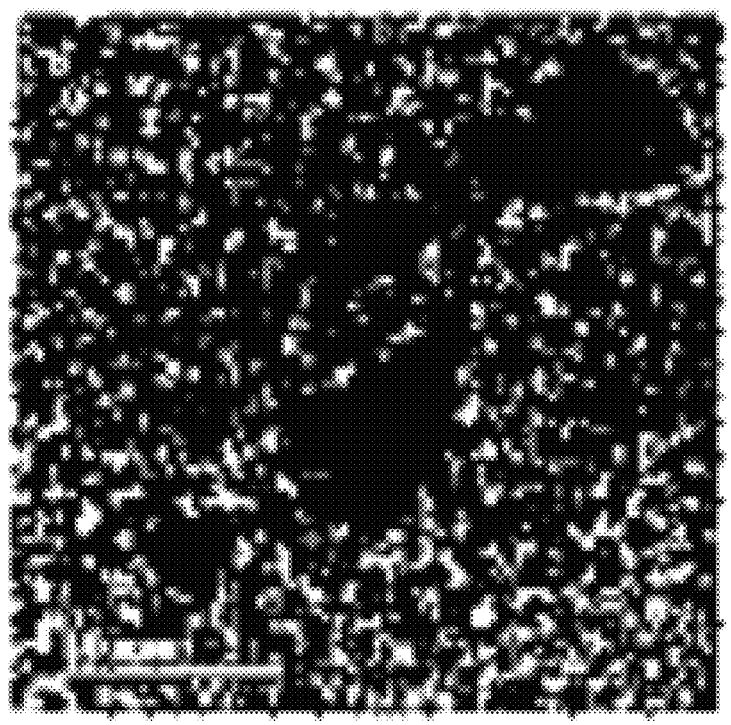
FIG. 7 is a High-Resolution Transmission Electron Microscopy ("HRTEM") image of Pt-prGO nanoparticles on a sheet.
Figure 8:
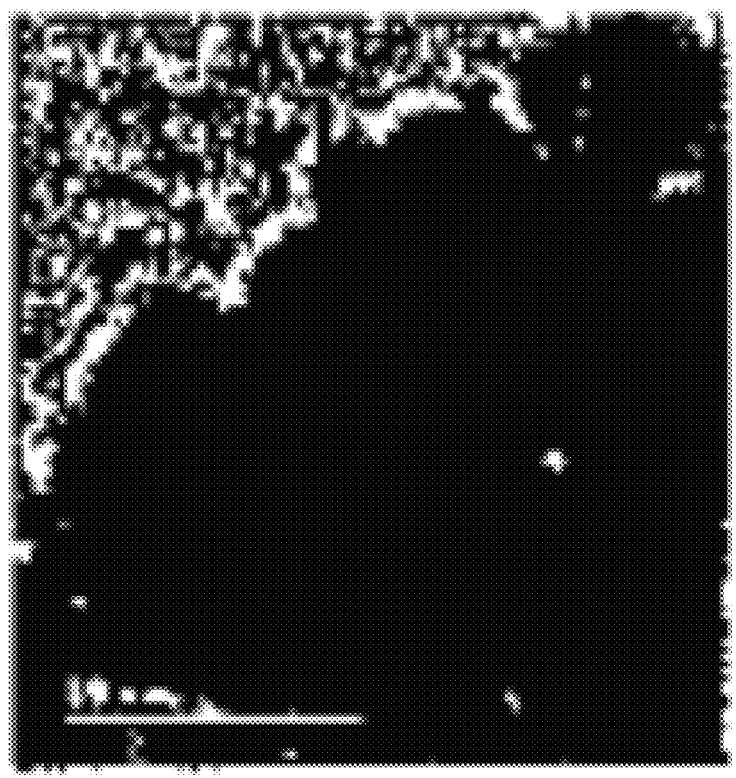
FIG. 8 is a HRTEM image of Pt-prGO nanoparticles on a sheet.
Figure 9:
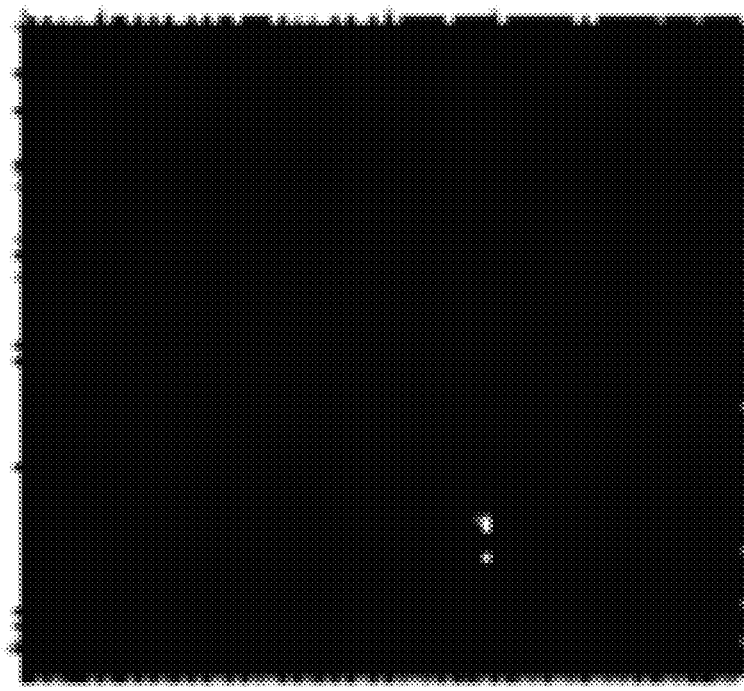
FIG. 9 is the magnified HRTEM image in FIG. 8 showing the lattice lines.

FIGS. 7 and 8 are HRTEM images of Pt-prGO nanoparticles on a sheet. FIG. 9 is the HRTEM image in FIG. 8 magnified so that the lattice lines are visible.

Figure 10:
FIG. 10 is a low magnification HRTEM image of Au-prGO nanoparticles on a sheet.
Figure 11:
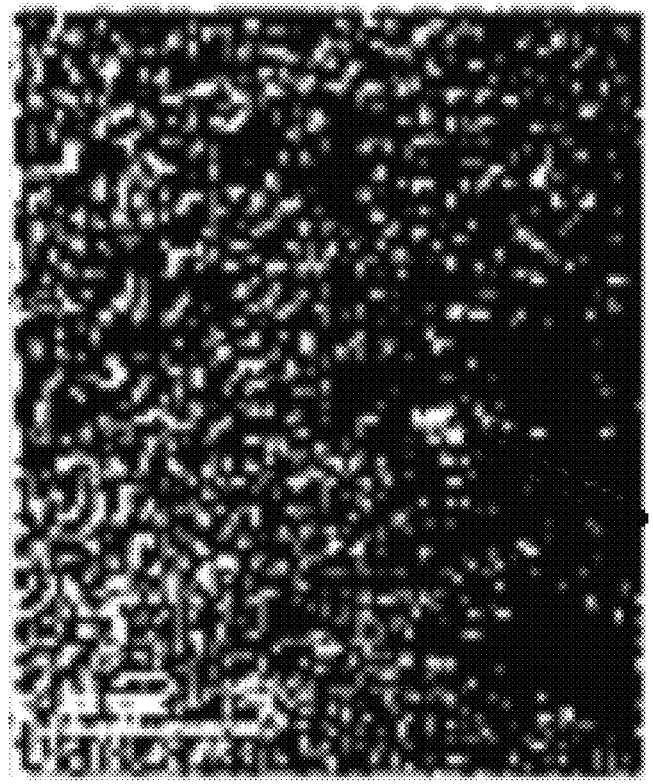
FIG. 11 is a high magnification HRTEM image of the Au-prGO nanoparticles shown in FIG. 10.

FIG. 10 is a low magnification HRTEM image of Au-prGO nanoparticles on a sheet and shows pinpoint particle distribution. FIG. 11 is a high magnification HRTEM image of the Au-prGO nanoparticles in FIG. 10 and it shows individual particles.

Figure 12:
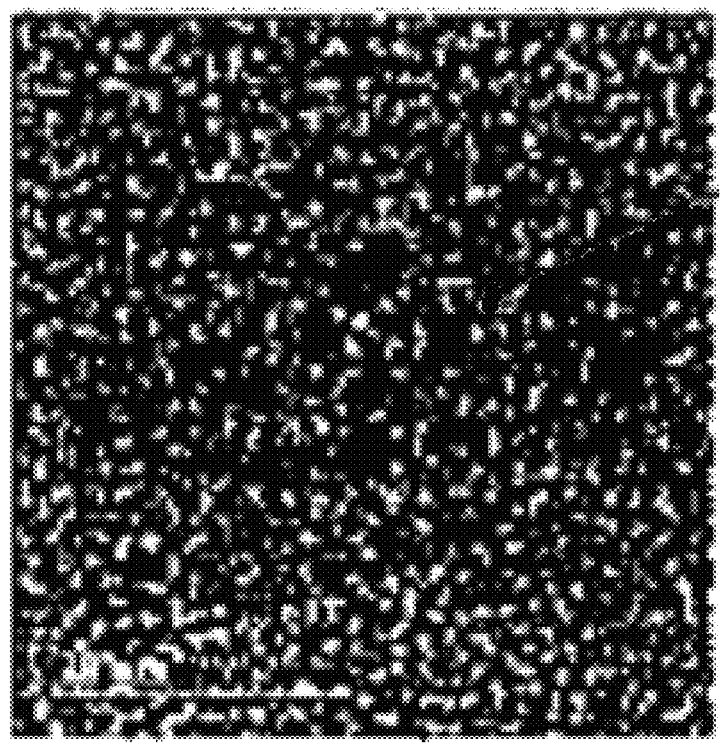
FIG. 12 is a HRTEM image of AuPt-prGO nanoparticles on a sheet.

FIG. 12 is a HRTEM image of AuPt-prGO nanoparticles on a sheet. No lattice lines are visible on the AuPt nanoparticles, which suggests that the nanoparticles were not crystalline, unlike the images in FIGS. 7 to 11. The lattice constant for prGO is midway between that of graphene and graphene oxide. This agrees with the Raman findings that prGO is a structural blend between GO and reduced GO ("rGO"). The calculated lattice constants are shown below in Table 1.

TABLE 1

| Sample | Pt-prGO | Au-prGO | AuPT-prGO |
|---|---|---|---|
| Material Measured | Pt | Au | PtAu |
| Calculated Lattice Constant | 3.98 ± 0.01 Å | 4.11 ± 0.01 Å | 2.60 ± 0.01 Å |
| Actual Lattice Constant | 3.92 Å | 4.08 Å | Graphene Oxide 2.73 Å |
|  |  |  | Graphene 2.46 Å |

Figure 13:
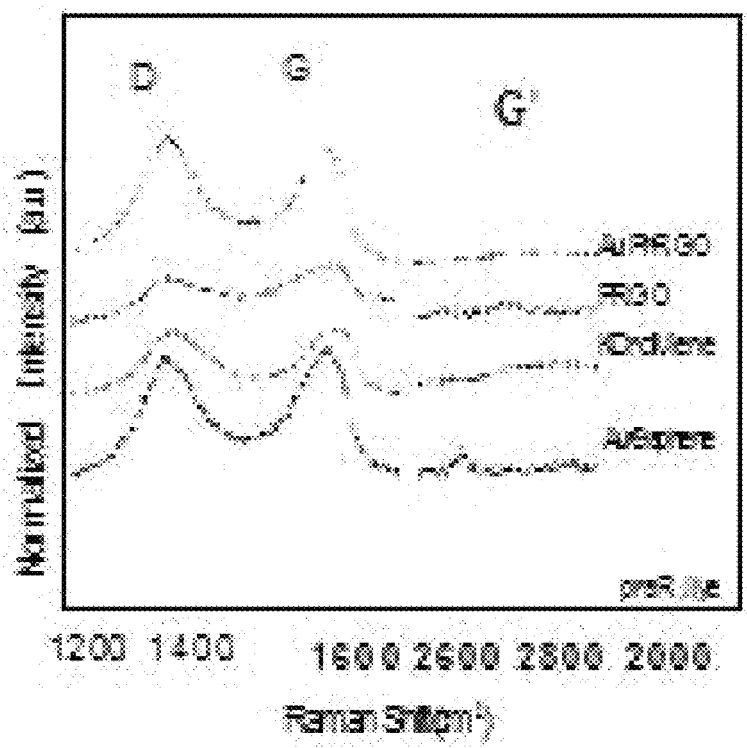
FIG. 13 is a graph showing of Raman spectroscopy points for graphene, Au-graphene, Pt-graphene, partially reduced graphene and AuPt-prGO.

It was found that Raman spectroscopy points to higher disorder in metalized prGO than in prGO and that prGO has more disorder than graphene. FIG. 13 shows Raman spectroscopy points for graphene, Au-graphene, Pt-graphene, partially reduced graphene and AuPt-prGO. The significant D band ("disorder band") indicates a considerable amount of defects in the material. Calculating the D to G peak intensity ratio indicates the amount of disorder. The D/G ratio increases as higher defect density causes elastic scattering.

Table 2 below lists the Raman Peak positions, areas and ratios for the test samples.

TABLE 2

| Material | D-position (cm$^{-1}$) | D-area | G-position (cm$^{-1}$) | G-area | D/G area ratio |
|---|---|---|---|---|---|
| Graphene | 1344 | 0.108 | 1569 | 0.497 | 0.217 |
| Au-prGO | 1350 | 0.768 | 1564 | 0.273 | 2.81 |
| Pt-prGO | 1359 | 0.442 | 1577 | 0.204 | 2.17 |
| prGO | 1357 | 0.329 | 1572 | 0.215 | 1.53 |
| AuPt-prGO | 1348 | 0.779 | 1579 | 0.291 | 2.68 |

Graphene has the lowest D/G ratio; prGO has a considerably higher D/G ratio, indicating greater disorder. However, all the metalized prGO's have D/G ratios significantly higher than prGO, suggesting that the increase in disorder is due to metal nanoparticles embedded in the sheets. Note that the D/G ratio for prGO (1.5) is midway between that of graphene (0.22) and the metalized prGO's (2.1-2.8), which indicates that prGO has more defects than graphene but less than the metalized material's partial reduction.

Figure 14:
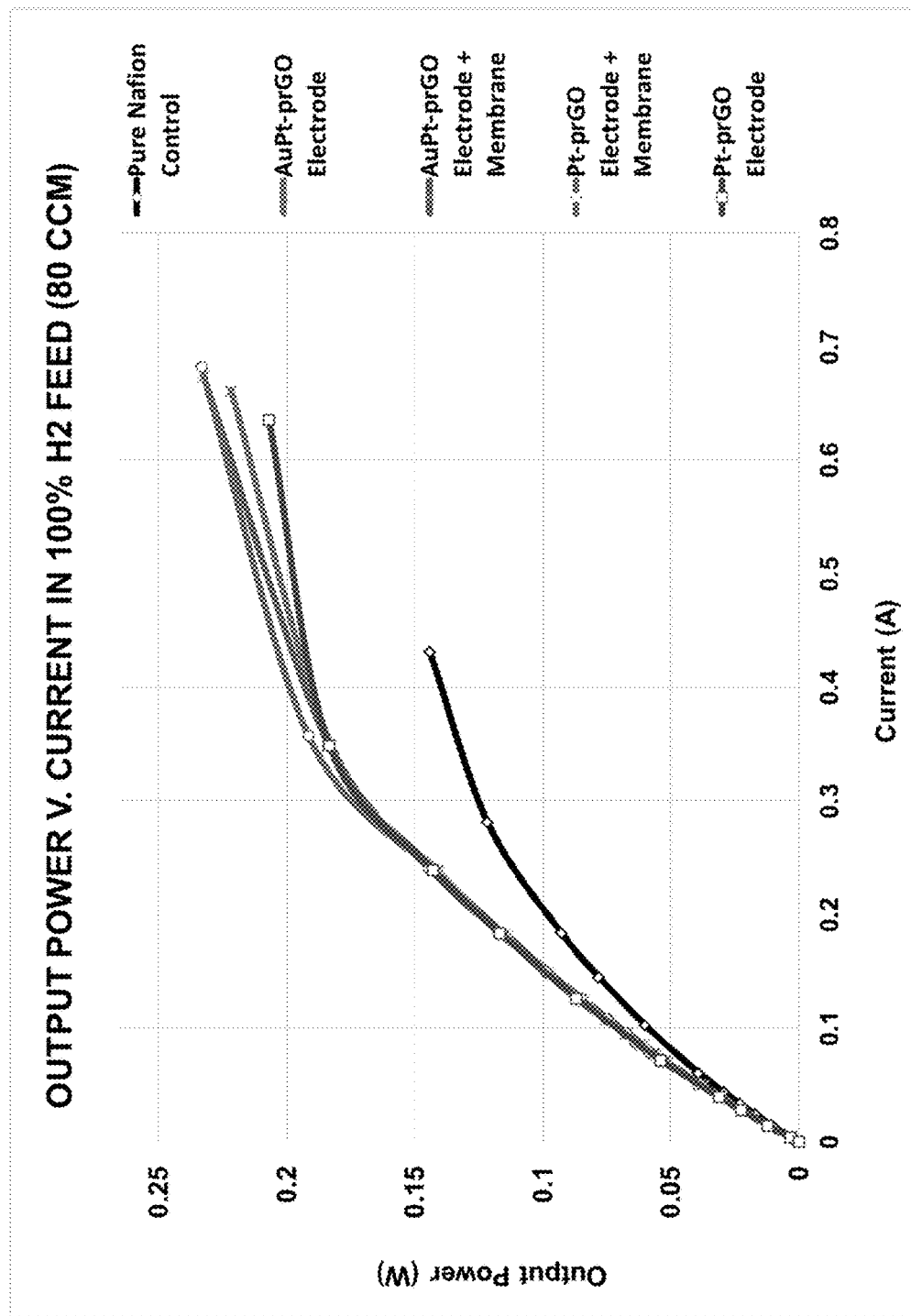
FIG. 14 is a graph of output power versus current in a fuel cell with 100% $H_2$ feed.
Figure 15:
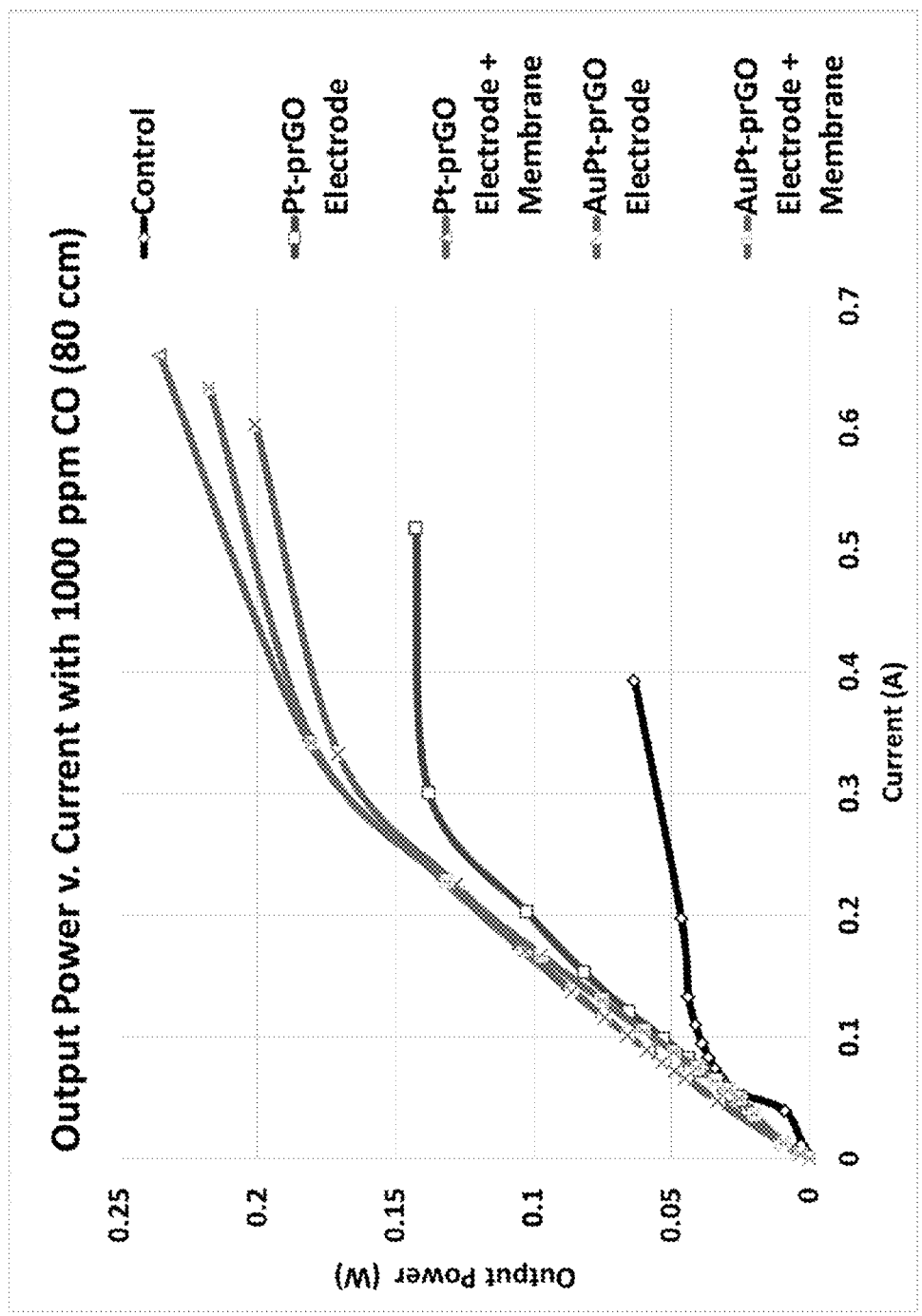
FIG. 15 is a graph of output power versus current in a fuel cell with 1,000 PPM CO and $H_2$ feed.

The addition of metalized prGO can be accomplished on PTFE-coated electrodes by exposing the electrodes to UV/ozone and then immersing the electrodes in the metal-prGO solution and drying overnight. Fuel cells with metalized prGO added to electrodes or both the electrodes and a NAFION® membrane have significantly increased output power over the control in a pure hydrogen gas feed. FIG. 14 is a graph of output power versus current in a fuel cell with 100% $H_2$ feed. Moreover, a fuel cell with metalized prGO-coated electrodes and a metalized prGO-coated NAFION® membrane maintains high power output even in the presence of a hydrogen gas feed containing 1000 ppm carbon monoxide gas. FIG. 15 is a graph of output power versus current for a metalized prGO-coated fuel cell with 1,000 PPM CO and $H_2$ feed.

Some metal-prGO combinations offer 100% resistance to CO poisoning at the CO levels tested. Table 3 below shows a comparison of treated and untreated electrodes and/or membranes 100% $H_2$ feed gas ($P_M$) and $H_2$ feed gas containing 1000 ppm CO (Pp). The test results show that, when the electrodes and membrane of a fuel cell are coated with Pt-prGO, the power output in the CO containing feed gas (Pp) is 92.2% (0.922) of the output when pure $H_2$ ($P_M$) is used. This compares to the untreated control fuel cell, wherein the out put for the CO containing feed gas (Pp) is only 57% (0.570) of the output when pure $H_2$ ($P_M$) is used. Moreover, Table 3 shows that, when the electrodes and membrane of a fuel cell are coated with AuPt-prGO, the power output in the CO containing feed gas (Pp) is 100% (1.00) of the output when pure $H_2$ ($P_M$) is used. This demonstrates that fuel cells with AuPt-prGO-coated membranes and electrodes are 100% resistant to CO poisoning.

TABLE 3

| | OUTPUT POWER (Watts) | | | | |
|---|---|---|---|---|---|
| Fuel Cell Setup | CONTROL Untreated Membrane + Electrodes | Pt-prGO treated Electrode + Membrane | AuPt-prGO treated Electrode + Membrane | Pt-prGO treated Electrodes | AuPt-prGO treated Electrodes |
| $P_P$ - 1000 ppm CO | 0.0952 W | 0.235 W | 0.217 W | 0.143 W | 0.201 W |
| (Compared to Control) | — | (247% increase) | (228% increase) | (150% increase) | (211% increase) |
| $P_M$ - 100% $H_2$ | 0.167 W | 0.255 W | 0.217 W | 0.223 W | 0.217 W |
| (Compared to Control) | — | (153% increase) | (130% increase) | (134% increase) | (130% increase) |
| $P_P$ to $P_M$ ratio | 0.570 | 0.922 | 1.00 | 0.641 | 0.926 |

Figure 16:
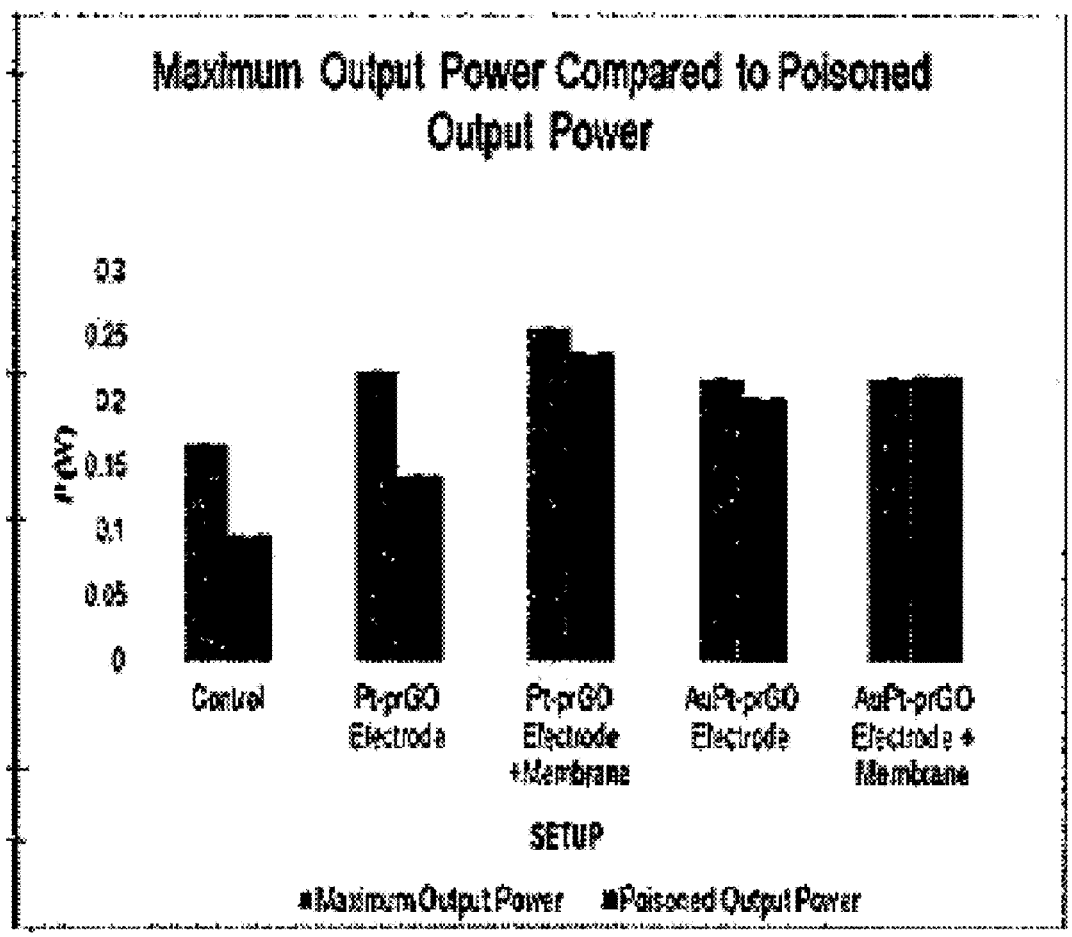
FIG. 16 is a bar graph comparing maximum output power for feeds containing 100% $H_2$ and poisoned feeds.

The results from Table 3 are shown in FIG. 16, which is a bar graph comparing maximum output power for metallized-prGO fuel cells with feeds containing 100% $H_2$ and a poisoned feed.

EXAMPLES

The examples set forth below serve to provide further appreciation of the invention but are not meant in any way to restrict the scope of the invention.

Example 1

Two polymer layers with a hydrophobic exterior surface were formed from a P3HT:PCBM polymer blend. A reduced graphene oxide suspension was applied by spin coating to the first layer. Tests showed that a contact angle of water on the exterior surface of the P3HT:PCBM layer was about 100 degrees. After UV/ozone exposure for seven minutes, a reduced graphene oxide suspension was applied by spin coating to the second layer. The contact angle of water was measured and found to be 38 degrees. Thus, as a result of the $UV/O_3$ exposure, the contact angle on the surface of the polymer layer was decreased from about 100 degrees to 38 degrees.

Figure 17:
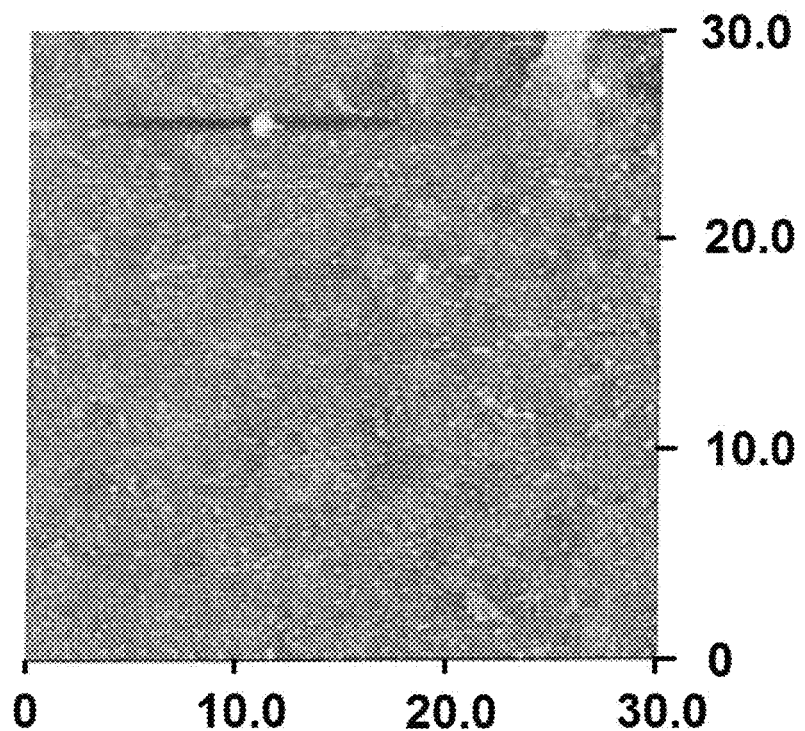
FIG. 17 is an atomic force microscope ("AFM") image of a polymer layer prior to UV/ozone exposure.
Figure 18:
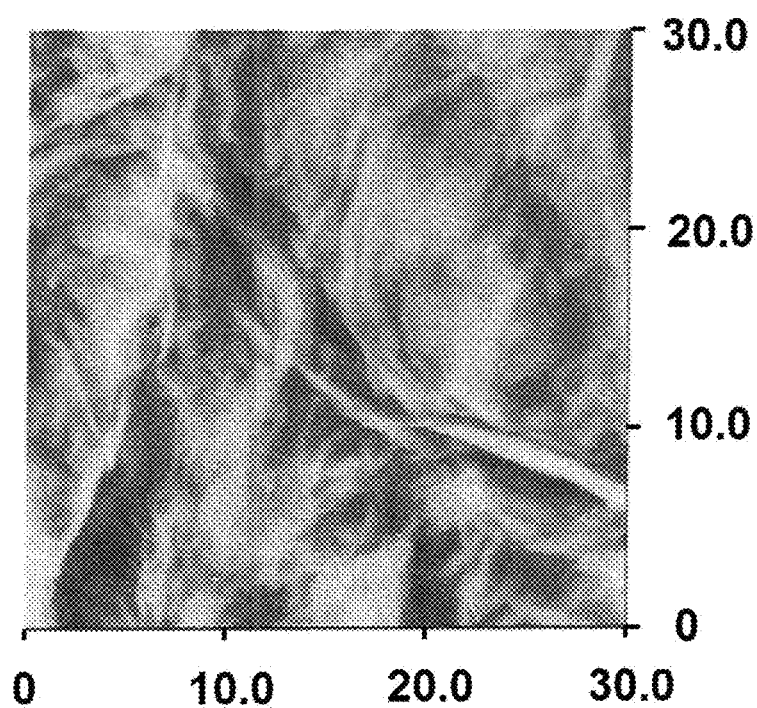
FIG. 18 is an atomic force microscope image of a polymer layer after UV/ozone exposure and the application of reduced graphene oxide.

After the RGO was applied to the two layers by spin coating, images of the two surfaces were taken using an atomic force microscope ("AFM") as shown in FIGS. 17-18. FIG. 17 shows very little graphene adhering to the polymer without first treating the surface with UV/ozone exposure. FIG. 18 shows a layer of graphene visibly adheres to the P3HT:PCBM layer after UV/ozone exposure.

Example 2

0.05 mmolar of $AuCl_4$ was stirred in graphene oxide in a 25% ethanol/75% $H_2O$ solvent overnight and then reduced with 15 mmolar $NaBH_4$. This produced gold-naoparticle-studded graphene sheets that were characterized by transmission electron microscopy ("TEM") and Fourier transform infrared spectroscopy ("FTIR"). These gold-graphene sheets were incorporated into the active layer of an organic polymer solar cell and they were found to enhance the efficiency significantly increase the performance of the organic polymer solar cell.

Example 3

Aliquots of graphene oxide (GO) were functionalized with platinum and/or gold nanoparticles using a simple desktop synthesis at room temperature. Partial reduction with $NaBH_4$ maintained hydrophilic solubility. PTFE-coated electrodes and NAFION® membranes were prepared by subjecting the exterior surfaces to ultraviolet/ozone ($UV/O_3$) exposure and then applying the platinum and/or gold functionalized solutions. The coated electrodes alone and then coated electrodes and membranes were first tested in a PEM fuel cell with a pure $H_2$ gas feed. The teats were repeated with a $H_2$ gas feed containing 1000 ppm of CO. Test arrangements averaged doubling the output power of the poisoned control, with the most effective, Pt-prGO electrode and membrane, yielding an output power 250% greater than the poisoned control. Additionally, each system's poisoned output power (Pp) was compared to its highest possible output power ($P_M$). The AuPt-prGO electrode and membrane setup displayed no reduction of output power even at 1000 ppm of CO at the resistances tested, which demonstrated a simple, cost-effective method of both improving PEMFC power output while reducing or even eliminating CO poisoning at room temperature.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

We claim:

1. A polymer electrolyte membrane fuel cell comprising:
a positive electrode;
a negative electrode;
a polyelectrolyte membrane having a hydrophobic exterior surface subjected to ultraviolet/ozone ($UV/O_3$) exposure, wherein the $UV/O_3$ exposure changes the hydrophobic, exterior surface to a hydrophilic exterior surface, and wherein the polyelectrolyte membrane is disposed between the positive electrode and the negative electrode; and
a solution comprising reduced graphene oxide and/or graphene oxide functionalized with nanoparticles of gold, platinum, palladium, silver, copper or their alloys or mixtures thereof, wherein the solution forms a coating on the hydrophilic exterior surface of the polymer electrolyte membrane and the positive and negative electrodes.

2. The polymer electrolyte membrane fuel cell according to claim 1, wherein the nanoparticles have an average particle diameter of from 1.88 nm to 3.54 nm.

3. The polymer electrolyte membrane fuel cell according to claim 1, wherein the polyelectrolyte membrane comprises a sulfonated tetrafluoroethylene based fluoropolymer-copolymer.

4. The polymer electrolyte membrane fuel cell according to claim 1, wherein the positive and negative electrodes are coated with a polymer.

5. The polymer electrolyte membrane fuel cell according to claim 4, wherein the polymer is polytetrafluoroethylene (PTFE).

6. The polymer electrolyte membrane fuel cell according to claim 1, wherein the reduced graphene oxide and/or graphene oxide is functionalized with nanoparticles of gold and platinum.

7. The polymer electrolyte membrane fuel cell according to claim 1, wherein the nanoparticles have a truncated cuboctahedron structure.

8. The polymer electrolyte membrane fuel cell according to claim 1 further comprising a gaseous composition containing hydrogen molecules ($H_2$) and carbon monoxide (CO) in contact with the positive electrode.

9. The polymer electrolyte membrane fuel cell according to claim 8, wherein the efficiency of the fuel cell is increased by at least 50% compared to fuel cells not coated with reduced graphene oxide and/or graphene oxide functionalized with nanoparticles.

10. The polymer electrolyte membrane fuel cell according to claim 1, wherein the functionalized solution comprises $AuCl_4$.

11. A method for making a polymer electrolyte fuel cell comprising:
forming a polymer electrolyte membrane having an exterior surface, wherein the exterior surface is hydrophobic;
subjecting the hydrophobic exterior surface of the polymer electrolyte membrane to ultraviolet/ozone (UV/

$O_3$) exposure, wherein the UV/$O_3$ exposure changes the hydrophobic exterior surface to a hydrophilic exterior surface;

disposing the polymer electrolyte membrane with the hydrophilic exterior surface between a positive electrode and a negative electrode;

preparing a solution comprising reduced graphene oxide and/or graphene oxide;

functionalizing the solution with nanoparticles of gold, platinum, palladium, silver, ferric oxide, copper or their alloys or mixtures thereof; and contacting the hydrophilic exterior surface of the polymer electrolyte membrane and the positive and negative electrodes with the functionalized solution.

12. The method for making a polymer electrolyte membrane fuel cell according to claim 11, wherein the polyelectrolyte membrane comprises a sulfonated tetrafluoroethylene based fluoropolymer-copolymer.

13. The method for making a polymer electrolyte membrane fuel cell according to claim 11, wherein the solution of nanoparticles comprises a solvent.

14. The method for making a polymer electrolyte membrane fuel cell according to claim 11, wherein the nanoparticles have an average particle diameter of from 1.88 nm to 3.54 nm.

15. The method for making a polymer electrolyte membrane fuel cell according to claim 11, wherein the nanoparticles have a truncated cuboctahedron structure.

16. The method for making a polymer electrolyte membrane fuel cell according to claim 11, the solution of nanoparticles comprises sodium borohydride ($NaBH_4$).

17. The method for making a polymer electrolyte membrane fuel cell according to claim 11, wherein the polymer electrolyte membrane comprises a sulfonated tetrafluoroethylene based fluoropolymer-copolymer.

18. The method for making a polymer electrolyte membrane fuel cell according to claim 11, comprising coating the positive and negative electrodes with a polymer and subjecting the polymer to ultraviolet/ozone (UV/$O_3$) exposure.

19. The method for making a polymer electrolyte membrane fuel cell according to claim 18, wherein the polymer coated onto the positive electrode and the negative electrode are is polytetrafluoroethylene (PTFE).

20. The method for making a polymer electrolyte membrane fuel cell according to claim 11, wherein the functionalized solution comprises $AuCl_4$.

* * * * *